(12) United States Patent
Shin

(10) Patent No.: US 9,590,189 B2
(45) Date of Patent: *Mar. 7, 2017

(54) HOST MATERIAL FOR BLUE PHOSPHOR, AND ORGANIC THIN FILM AND ORGANIC LIGHT-EMITTING DEVICE INCLUDING SAME

(75) Inventor: Dong Yoon Shin, Seoul (KR)

(73) Assignee: Youl Chon Chemical Co., Ltd., Seoul (KR)

( * ) Notice: Subject to any disclaimer, the term of this patent is extended or adjusted under 35 U.S.C. 154(b) by 437 days.

This patent is subject to a terminal disclaimer.

(21) Appl. No.: 14/132,000

(22) PCT Filed: Jul. 13, 2012

(86) PCT No.: PCT/KR2012/005620
§ 371 (c)(1),
(2), (4) Date: Jan. 10, 2014

(87) PCT Pub. No.: WO2013/009141
PCT Pub. Date: Jan. 17, 2013

(65) Prior Publication Data
US 2014/0159027 A1 Jun. 12, 2014

(30) Foreign Application Priority Data
Jul. 13, 2011 (KR) .................. 10-2011-0069297

(51) Int. Cl.
H01L 29/08 (2006.01)
H01L 51/00 (2006.01)
C09K 11/06 (2006.01)
H05B 33/14 (2006.01)
H01L 51/52 (2006.01)
H01L 51/50 (2006.01)

(52) U.S. Cl.
CPC .......... *H01L 51/0072* (2013.01); *C09K 11/06* (2013.01); *H01L 51/0079* (2013.01); *H01L 51/0094* (2013.01); *H01L 51/5262* (2013.01); *H05B 33/14* (2013.01); *C09K 2211/1014* (2013.01); *C09K 2211/1029* (2013.01); *H01L 51/5016* (2013.01)

(58) Field of Classification Search
USPC .......................................... 257/40; 313/504
See application file for complete search history.

(56) References Cited

U.S. PATENT DOCUMENTS

| | | | |
|---|---|---|---|
| 2005/0064238 A1 | 3/2005 | Lee et al. | |
| 2005/0127826 A1 | 6/2005 | Qiu et al. | |
| 2005/0175858 A1 | 8/2005 | Jung et al. | |
| 2007/0087219 A1* | 4/2007 | Ren ........................ | C09K 11/06 428/690 |
| 2007/0224446 A1* | 9/2007 | Nakano .................. | C09K 11/06 428/690 |
| 2009/0224658 A1* | 9/2009 | Iwakuma .............. | C07F 7/0812 313/504 |
| 2009/0302752 A1 | 12/2009 | Parham et al. | |
| 2012/0298966 A1* | 11/2012 | Zeng ........................ | C07F 7/08 257/40 |

FOREIGN PATENT DOCUMENTS

| | | |
|---|---|---|
| CN | 101096357 A | 1/2008 |
| CN | 101165051 A | 4/2008 |
| JP | 2000-351966 | * 12/2000 |
| JP | 2004200104 A | 7/2004 |
| JP | 2004253298 A | 9/2004 |
| JP | 2005104971 A | 4/2005 |
| KR | 1020050040960 A | 5/2005 |
| KR | 100522697 B1 | 10/2005 |
| KR | 100730178 B1 | 6/2007 |
| KR | 1020070115478 A | 12/2007 |
| KR | 1020110041952 A | 4/2011 |
| KR | 1020110046839 A | 5/2011 |

* cited by examiner

*Primary Examiner* — Austin Murata
(74) *Attorney, Agent, or Firm* — The Webb Law Firm

(57) ABSTRACT

Provided are a host material for a blue phosphor, and an organic thin film and an organic light-emitting device including the same. The host material for a blue phosphor is such that a carbazole compound is bonded around a central atom, wherein the central atom is a Group 14 element, and the carbazole compound bonded around the central atom is 3 or 4, wherein the carbazole compound. includes carbazole in which an alkyl group is substituted The host material for a blue phosphor has high triplet energy (ET) and excellent electrical mobility and thermal stability. As a result, the organic thin film, which includes the host material, and the organic light-emitting device, which includes the organic thin film, implement a deep blue color and have excellent luminous efficiency.

8 Claims, 4 Drawing Sheets

TripletEnergy

HOST MATERIAL FOR BLUE PHOSPHOR, AND ORGANIC THIN FILM AND ORGANIC LIGHT-EMITTING DEVICE INCLUDING SAME

CROSS-REFERENCE TO RELATED APPLICATIONS

This application is the United States national phase of International Application No. PCT/KR2012/005620 filed Jul. 13, 2012, and claims priority to Korean Patent Application No. 10-2011-0069297 filed Jul. 13, 2011, the disclosures of which are hereby incorporated in their entirety by reference.

TECHNICAL FIELD

The present specification relates to a host material for a blue phosphor, and an organic thin film and an organic light-emitting device including the same, and more particularly, to a host material for a blue phosphor, in which a Group 14 element is used as a core and a carbazole compound in which an alkyl group is substituted is bonded therearound to provide excellent triplet energy and charge mobility, an organic thin film including the host material, and an organic light-emitting device including the organic thin film.

BACKGROUND ART

Speed as well as precision of information occupies an important part in the early 21th century, and thus an information display field occupies a very important part among various industrial fields. A display has moved from a known CRT display to a LCD that is a flat panel display capable of being carried, and, currently, the LCD is most frequently used. However, since the LCD is a photodetector, there is a technical limit in terms of brightness, light and darkness, viewing angle, and enlargement, and thus novel devices overcoming the disadvantages need to be developed, and one of the devices is an organic light-emitting device (hereinafter, referred to as 'OLEDs').

The OLEDs in the limelight as a next-generation display has been researched for several years in various laboratories such as schools, institutes, and companies, and academic and industrial researches thereof have been actively performed in various fields such as electric, electronics, materials, chemistry, physics, and optics. As a research result, a PM-mode OLEDs is introduced into some electronic apparatuses, for example, the PM-mode OLEDs is used in an external window of a cellular phone, and currently, researches and industrialization for applying an AM-mode OLEDs to mobile displays such as PDAs, cellular phones, and game machines are performed.

However, in order to successfully industrialize the OLEDs display, some problems should be solved, and one of the problems relates to a material.

Generally, the OLEDs has a laminate structure including an anode formed of a transparent electrode such as ITO; an organic thin film including a light-emitting region; and a cathode formed of metal, which are formed on a glass substrate. In this case, the organic thin film includes a hole transport layer (HTL); an emitting layer (EML) formed on the hole transport layer (HTL); and an electron transport layer (ETL) formed on the emitting layer (EML).

If an electric field is applied to the OLEDs having the aforementioned structure, a hole is injected from the anode, an electron is injected from the cathode, and the injected hole and electron pass through the hole transport layer (HTL) and the electron transport layer (ETL), respectively, and recombined in the emitting layer (EML) to form light-emitting excitons. In addition, the formed light-emitting excitons emit light while being transferred to a ground state.

Currently, it is known that phosphorescent light-emitting materials as well as fluorescent light-emitting materials are capable of being used as the OLEDs, and the phosphorescent light emission is performed based on a mechanism that after electrons are transferred from the ground state to an excited state, singlet excitons are transferred to triplet excitons by radiationless transferring through intersystem crossing, and the triplet excitons are then transferred to the ground state to emit light. When the triplet excitons are transferred, since the triplet excitons is not capable of being directly transferred to the ground state (spin forbidden) but is transferred to the ground state after flipping of electron spins is performed, the phosphorescent light emission has a longer life-span (emission time) as compared to the fluorescent light emission. That is, an emission duration of the fluorescent light emission is just several nano seconds, but that of the phosphorescent light emission corresponds to several micro seconds, which are a relatively long time.

In the case of phosphorescent organic light-emitting device (PHOLEDs), selection of a phosphorescent light-emitting host material directly affects luminous efficiency. Since light emission of a phosphorescent material occurs from a triplet, as triplet energy (ET) of a host is higher than triplet energy (ET) of a dopant, transferring of triplet energy (ET) from a host material to a dopant material may be effectively performed.

Further, generally, since triplet energy (ET) is lower than singlet energy by about 1 eV, as compared to a fluorescent material, it is preferable to use a material having a large interval between a HOMO (highest occupied molecular orbital) and a LUMO (lowest unoccupied molecular orbital) as the host material. That is, if triplet energy of the host is lower than triplet energy of the guest phosphorescent material, since endothermic energy transferring is used, external luminous efficiency is reduced, but if triplet energy of the host is higher than triplet energy (ET) of the dopant, since exothermic energy transferring is used, high luminous efficiency is exhibited. Accordingly, triplet energy (ET) of the host material should be high in order to increase luminous efficiency.

Many studies of the phosphorescent organic light-emitting device (PHOLEDs) have been conducted in order to implement high luminous efficiency, an excellent color coordinate, a rapid reaction speed, and a wide viewing angle after the OLED had been reported. As a result, a technology having high luminous efficiency of 29% in the case of a green color and 15% in the case of a red color is reported.

However, in the case of a blue color, there are disadvantages in that low luminous efficiency is exhibited and the color coordinate is not excellent as compared to the green and red colors. In order to solve this, approaches broadly using two methods have been attempted.

One of the methods is an approach method mainly aiming at improvement of the color coordinate of the phosphorescent organic light-emitting device (PHOLEDs). However, in the case of this method, the excellent color coordinate is exhibited by using a novel phosphorescent material, but it is difficult to apply this method in practice due to low efficiency.

The other approach method is an approach method mainly aiming at high efficiency instead of the color coordinate.

This method is a method of maximizing efficiency through a design of a novel device as well as a novel material, and recently, many studies have been conducted to develop blue phosphorescent organic light-emitting devices (PHOLEDs).

For example, Korean Patent Laid-Open Publication No. 10-2011-0041952 [Prior Patent Document 1] suggests a carbazole compound represented by a specific Chemical Formula as a host material for a blue phosphor. Further, Korean Patent Laid-Open Publication No. 10-2011-0046839 [Prior Patent Document 2] suggests a host material for a blue phosphor, in which Si is used as a core and alkyl, aryl, and two arylenes are bonded around the core.

In order to allow the phosphorescent organic light-emitting device (PHOLEDs) to implement a deep blue color and have high luminous efficiency, triplet energy (ET) of the host material should be high. Further, an electrical property such as charge mobility should be excellent, and thermal stability should be excellent. However, triplet energy (ET) of a known host material is less than 3.0 eV which is low. In addition, charge mobility and thermal stability are low. Accordingly, a known blue phosphorescent organic light-emitting device (PHOLEDs) has slight insufficiency in views of implementation of the deep blue color and exhibition of high luminous efficiency.

[Prior Patent Document 1] Korean Patent Laid-Open Publication No. 10-2011-0041952
[Prior Patent Document 2] Korean Patent Laid-Open Publication No. 10-2011-0046839

Technical Problem

The present invention has been made in an effort to provide a host material for a blue phosphor having high triplet energy (ET≥3.0 eV), an excellent electrical property such as charge mobility, and excellent thermal stability and the like, an organic thin film including the host material, and an organic light-emitting device (OLEDs) including the organic thin film.

Technical Solution

An exemplary embodiment of the present invention provides a host material for a blue phosphor, wherein a carbazole compound is bonded around a central atom, the central atom is a Group 14 element, the number of carbazole compounds bonded around the central atom is 3 or 4, and the carbazole compound includes carbazole in which an alkyl group is substituted.

According to a preferable exemplary embodiment, the host material according to the present invention is represented by the following Chemical Formula. The central atom M is preferably Si, Ge, or C.

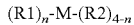  [Chemical Formula 1]

(in Chemical Formula 1, M is the Group 14 element, n is 3 or 4, R1 is the carbazole compound in which the alkyl group is substituted in carbazole, and R2 is selected from hydrogen, an aliphatic compound, and an aromatic compound).

Further, the exemplary embodiments of the present invention provide an organic thin film for an organic light-emitting device including the host material for a blue phosphor. In this case, it is preferable that the organic thin film includes a hole transport layer, a emitting layer, and an electron transport layer, and that the emitting layer includes the host material for a blue phosphor according to the exemplary embodiments of the present invention.

In addition, the exemplary embodiments of the present invention provide an organic light-emitting device (OLEDs) including the organic thin film as described above.

Advantageous Effects

A host material for a blue phosphor according to exemplary embodiments of the present invention has high triplet energy (ET) of 3.0 eV or more, an excellent electrical property such as charge mobility, and excellent thermal stability and the like. As a result, an organic thin film including the host material, and an organic light-emitting device including the organic thin film may implement a deep blue color and have excellent luminous efficiency.

DESCRIPTION OF DRAWINGS

The above and other objects, features and advantages of the present invention will become apparent from the following description of preferred embodiments given in conjunction with the accompanying drawings, in which.

BEST MODE

Figure 1:
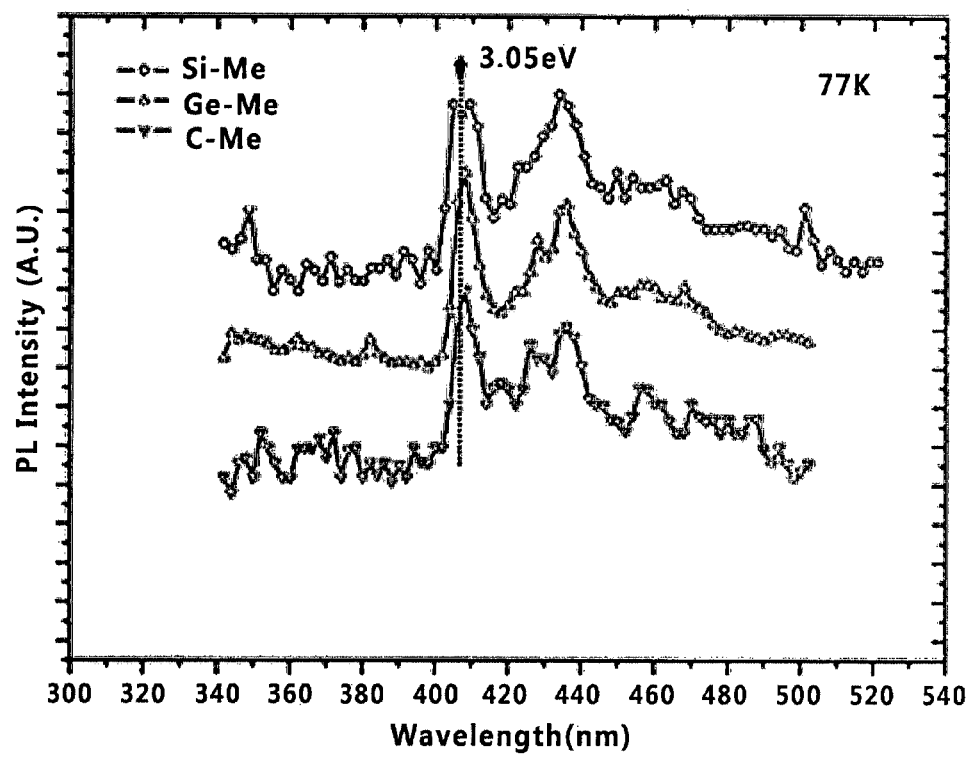
FIG. 1 is a graph illustrating a measurement result of triplet energy of a host material manufactured according to an Example of the present invention.

As described above, in order to implement a deep blue color and exhibit high luminous efficiency by an organic light-emitting device (OLEDs) implementing a blue phosphor, that is, a blue phosphor organic light-emitting device (PHOLEDs), triplet energy (ET) of a host material should be high. Further, an electrical property such as charge mobility should be excellent, and thermal stability and the like should be excellent.

Therefore, the present inventors have repeatedly studied the host material for a blue phosphor, resulting in the finding that in the case where a Group 14 element is used as a core and a carbazole compound into which a specific substituent group is introduced is bonded around the core, high triplet energy of 3.0 eV or more (ET≥3.0 eV) is secured. Further, it could be found that in the case where the carbazole compound is bonded to the Group 14 element and three or more, that is, three or four carbazole compounds are bonded around the Group 14 element, charge mobility and thermal stability are very excellent.

Hereinafter, exemplary embodiments of the present invention will be described in detail.

A host material for a blue phosphor (hereinafter, abbreviated to 'host material') according to the exemplary embodiments of the present invention has a structure where a carbazole compound is bonded around a central atom. In this case, the central atom is selected from Group 14 elements, and three or more, that is, three or four carbazole compounds are bonded around the Group 14 element that is the central atom. In addition, the carbazole compound has a structure where one or more alkyl groups ($C_nH_{2n+1}$—) are substituted in a molecule.

The central atom is not limited as long as the central atom is the Group 14 element. The central atom is preferably selected from Si (silicon), Ge (germanium), or C (carbon). The central atom is more preferably selected from Si or Ge.

In the present specification, 'carbazole' is generally named, and means a matter where two 6-atom benzene cycles are bonded to both sides of a 5-atom cycle including nitrogen (N) (refer to the following Chemical Formula 3).

Further, in the present specification, 'carbazole compound' means a carbazole-based compound including at least one carbazole in the molecule. That is, in the present specification, the carbazole compound may include one or two or more carbazoles in the molecule, and optionally further include another compound in addition carbazole. Specifically, the carbazole compound may have one carbazole or two or more carbazoles in the molecule. In addition, the carbazole compound may include other compounds, for example, arylene (benzene cycle and the like), a heterocycle, and the like in addition to carbazole. Further, the carbazole compound may have a structure where at least one alkyl group ($C_nH_{2n+1}$—) is substituted. In this case, the alkyl group is substituted in carbazole.

Accordingly, in the exemplary embodiments of the present invention, as defined above, the carbazole compound includes at least one carbazole in the molecule and at least one alkyl group is substituted in carbazole. In this case, the alkyl group is preferably substituted in a benzene cycle of carbazole. As described above, carbazole has two benzene cycles, and in this case, the alkyl group may be substituted in at least one (any one or both two) of the two benzene cycles. In addition, one or two or more alkyl groups may be substituted in one benzene cycle.

Further, in the exemplary embodiments of the present invention, the alkyl group is not limited. That is, the number of carbon atoms of the alkyl group is not limited. The alkyl group may be selected from, for example, a C1 to C20 alkyl group. Specific examples of the alkyl group may be selected from a methyl group, an ethyl group, a propyl group, a butyl group, and the like, but are not limited thereto. In addition, the propyl group includes a n-propyl group and an iso-propyl group, and the butyl group includes a n-butyl group, an iso-butyl group, and a tertiary-butyl group. The alkyl group may be preferably selected from the methyl group, the tertiary-butyl group, and the like.

Moreover, three or more (three or four) carbazole compounds are bonded around the central atom, and in this case, three or more carbazole compounds may be the same as or different from each other.

In the exemplary embodiments of the present invention, the host material may be represented by the following Chemical Formula 1.

$(R1)_n\text{-}M\text{-}(R2)_{4-n}$ [Chemical Formula 1]

In Chemical Formula 1, M is the central atom and the Group 14 element. As described above, M is preferably Si, Ge, or C. In addition, in Chemical Formula 1, n is a natural number and 3 or 4. Further, in Chemical Formula 1, R1 is the carbazole compound and includes carbazole in which one or more alkyl groups are substituted.

In Chemical Formula 1, in the case where n is 3, R2 is not limited. R2 may be selected from hydrogen, an aliphatic compound, an aromatic compound, and the like. Further, R2 is the aliphatic compound and may be a heterocyclic compound. Specific examples of R2 may be selected from hydrogen, an alkyl group, an alkoxy group, a cycloalkyl group, an alkoxycarbonyl group, an aryl group, an aryloxy group, and the like. Further, R2 may be, for example, a cyclic compound in which two or more alkyl groups and the like form a cycle. More specific examples of R2 may be selected from C1 to C20 alkyl; C6 to C20 aryl; C3 to C20 heteroaryl; C1 to C20 alkyl in which C3 to C20 heteroaryl is substituted; C6 to C20 aryl in which C1 to C20 alkyl or C3 to C20 heteroaryl is substituted, and the like. In the following Chemical Formula 2, several compounds usable as R2 are exemplified. According to the exemplary embodiment, R2 may be any one selected from the compounds illustrated in the following Chemical Formula 2.

[Chemical Formula 2]

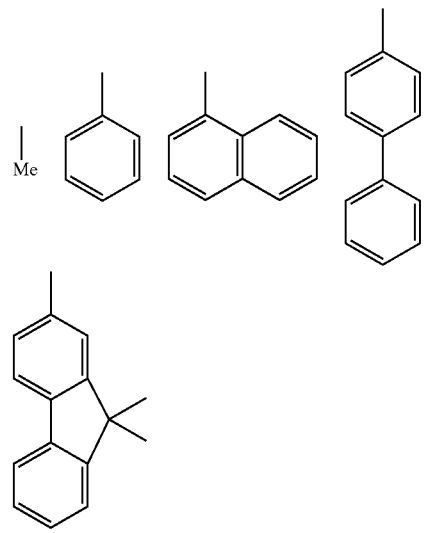

In Chemical Formula 2, 'Me' is a methyl group ($CH_3$—). In the exemplary embodiments of the present invention, R2 of Chemical Formula 1 is not limited, and as exemplified in Chemical Formula 2, may be selected from an alkyl group (Me and the like); an aryl group (phenylene, biphenylene, naphthalene, anthracenylene, and the like) including one or more benzene cycles; a C3 or more heterocyclic compound; a combination thereof, and the like.

Further, the host material according to the exemplary embodiments of the present invention may be specifically selected from the group illustrated in the following Chemical Formula 1-1.

[Chemical Formula 1-1]

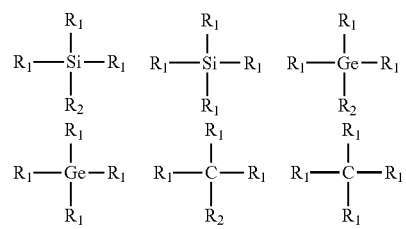

In Chemical Formula 1-1, R1 is the carbazole compound, and R2 is the same as above. As exemplified in Chemical Formula 1-1, in the exemplary embodiment of the present invention, three or four carbazole compounds (R1) are bonded around the central atom (Si, Ge, or C). In this case, three or four R1s in Chemical Formula 1-1 may be the same as or different from each other.

Further, the carbazole compound (R1) may be represented by the following Chemical Formula 3 according to the preferable exemplary embodiment.

[Chemical Formula 3]

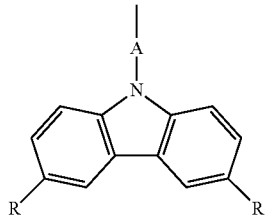

In Chemical Formula 3, R is an alkyl group as described above. In Chemical Formula 3, the number of carbon atoms of the alkyl group (R) is not limited, and may be selected from, for example, a C1 to C20 alkyl group. That is, in the present invention, the alkyl group (R) is represented by $C_nH_{2n+1}$—, herein, n is a natural number of 1 or more, an upper limit thereof is not limited, and n is, for example, 1 to 20.

Further, in the present invention, the carbazole compound (R1) may include at least one carbazole, and as described above, may further include another compound, for example, a compound selected from arylene, a heterocyclic compound, and the like in addition to carbazole. In Chemical Formula 3, A represents this compound. That is, in Chemical Formula 3, A may be selected from arylene, the heterocyclic compound, and the like, and more specifically, in the Chemical Formula, A may be selected from C6 to C20 arylene; C3 to C20 heteroarylene; C6 to C20 arylene in which C1 to C20 alkyl is substituted; C3 to C20 heteroarylene in which C1 to C20 alkyl is substituted; C6 to C20 arylene in which C3 to C20 heteroaryl is substituted, and the like. Chemical Formula 3 includes one carbazole, and a matter where a compound A is bonded to nitrogen (N) of carbazole is exemplified.

Moreover, at least one alkyl group (R) is substituted in carbazole, and in this case, one to eight alkyl groups (R) may be substituted in one carbazole. Preferably, one or four alkyl groups (R) may be substituted in one carbazole. Chemical Formula 3 exemplifies substitution of two alkyl groups (R) in carbazole. Further, as exemplified in Chemical Formula 3, the alkyl groups (R) may be substituted in two benzene cycles, and a substitution position of the alkyl group (R) is not limited.

According to the more specific exemplary embodiment, the carbazole compound (R1) may be selected from matters represented by the following Chemical Formulas 4 to 8. That is, the carbazole compound (R1) may be one or two or more selected from matters illustrated in the following Chemical Formulas 4 to 8.

[Chemical Formula 4]

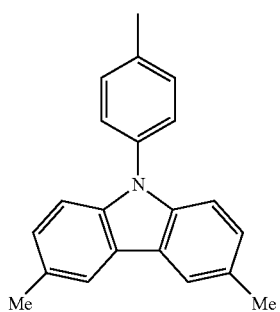

[Chemical Formula 5]

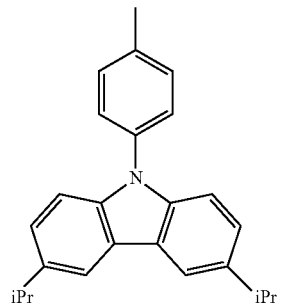

[Chemical Formula 6]

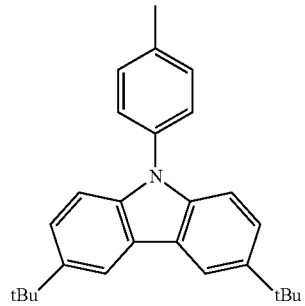

[Chemical Formula 7]

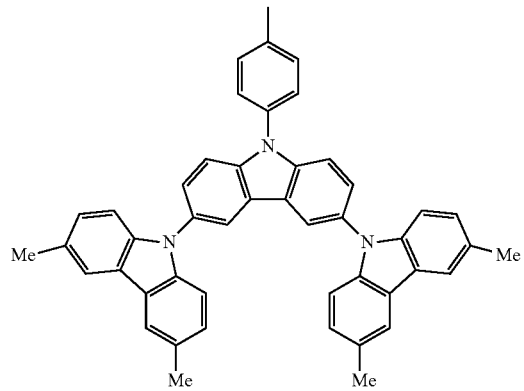

[chemical Formula 8]

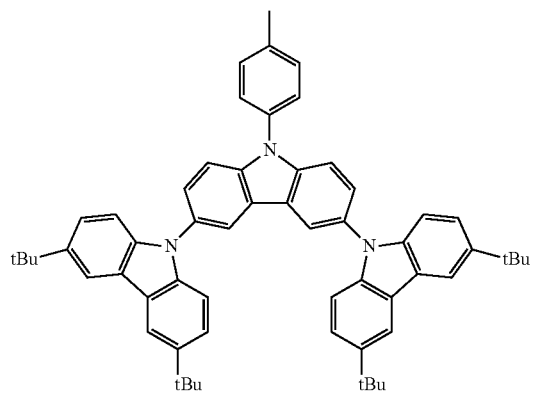

Chemical Formulas 4 and 7 exemplify that the alkyl group (R) substituted in carbazole is a methyl group. That is, in Chemical Formulas 4 and 7, 'Me' is the methyl group. Further, Chemical Formula 5 exemplifies that the alkyl group (R) substituted in carbazole is a propyl group. That is, in Chemical Formula 5, 'iPr' is an iso-propyl group. In addition, Chemical Formulas 6 and 8 exemplify that the alkyl group (R) substituted in carbazole is a butyl group. That is, in Chemical Formulas 6 and 8, 'tBu' is a tertiary-butyl group.

Further, as described above, in the exemplary embodiment of the present invention, the carbazole compound (R1) may include at least one carbazole, and the number of carbazole compounds is not particularly limited, but one to twenty carbazoles may be included. Preferably, one to ten carbazoles may be included. Chemical Formulas 4 to 6 exemplify that the carbazole compound (R1) includes one carbazole in the molecule, and Chemical Formulas 7 and 8 exemplify that three carbazoles are included.

Meanwhile, the host material according to the exemplary embodiments of the present invention may be manufactured (synthesized) by various methods. For example, the host material may be synthesized through the following Reaction Equations 1 to 3. Manufacturing of the host material according to the exemplary embodiments of the present invention is not limited by the methods exemplified in the following Reaction Equations 1 to 3, but may be performed by various synthesis methods.

[Reaction Equation 1]

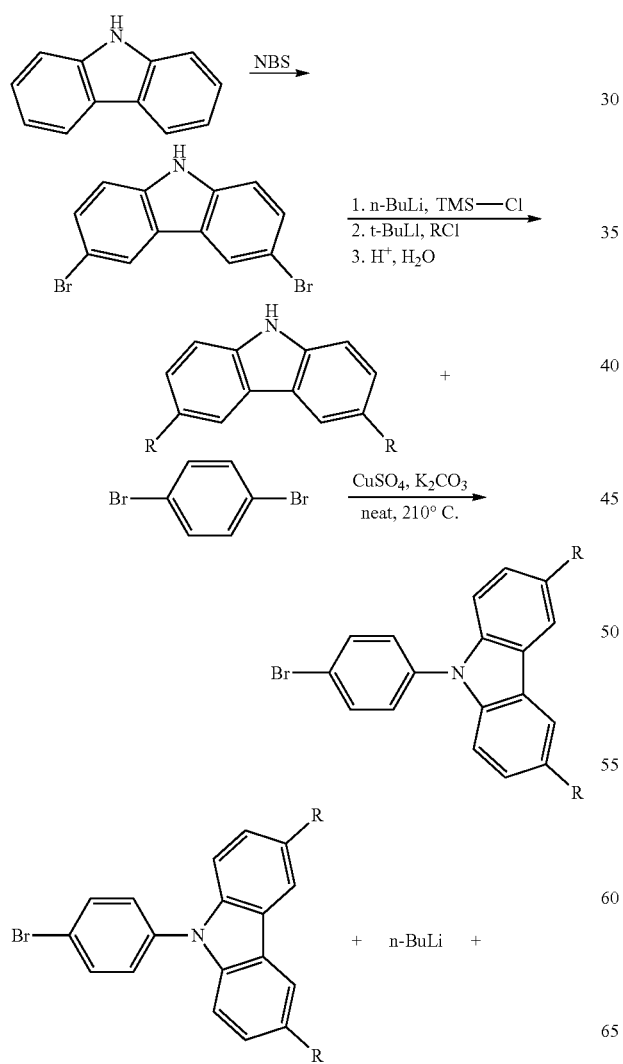

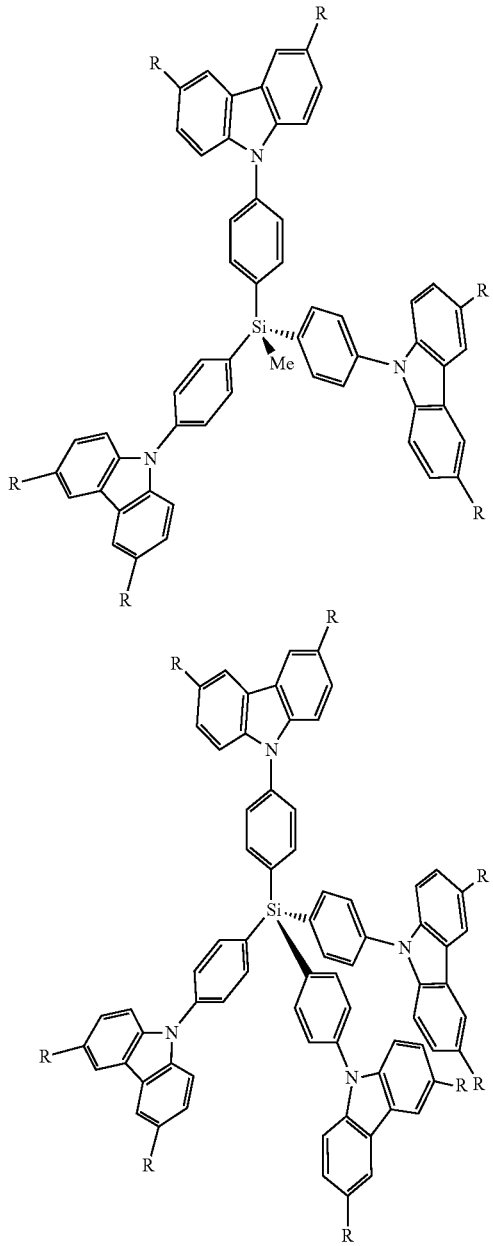

First, in the case where the central atom (M) is Si, the host material may be synthesized according to Reaction Equation 1.

Like in Reaction Equation 1, NBS (N-bromosuccinamide) is added to carbazole to substitute bromine (Br) and RCl (R is the alkyl group, and for example, chloromethyl) is then added to substitute the alkyl group (R) in carbazole. In addition, 1,4-dibromobenzene is added to generate the carbazole compound (1-bromo-4-(N-carbazole-di-methyl)benzene) in which A is benzene in Chemical Formula 3. Thereafter, the generated carbazole compound is dissolved in THF (tetrahydrofuran), and then reacted with n-BuLi (butyllithium) and a silane compound (for example, $SiCl_3$ or $SiCl_4$).

In this case, the number of carbazole compounds bonded to Si may be 3 or 4 according to the silane compound. In addition, a type of alkyl group substituted in carbazole may be determined according to a type of R of RCl.

[Reaction Equation 2]

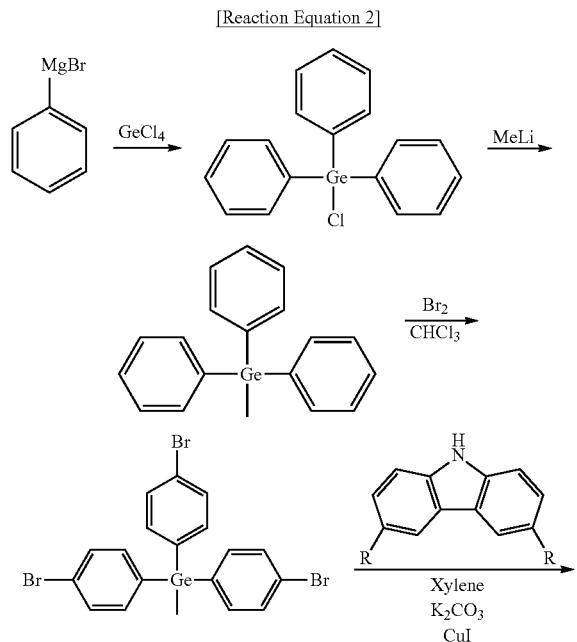

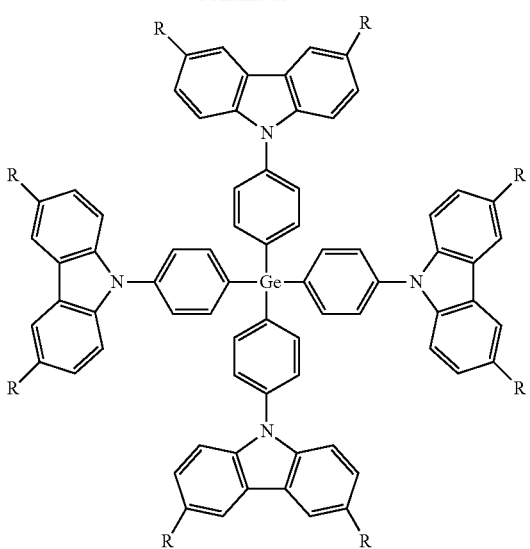

First, in the case where the central atom (M) is Ge, synthesis may be performed according to Reaction Equation 2.

Like in Reaction Equation 2, $GeCl_4$ is added to bromobenzene to obtain a Ge-compound in which three or four bromobenzenes are bonded around Ge. In addition, carbazole in which the alkyl group (R) is substituted is reacted.

[Reaction Equation 3]

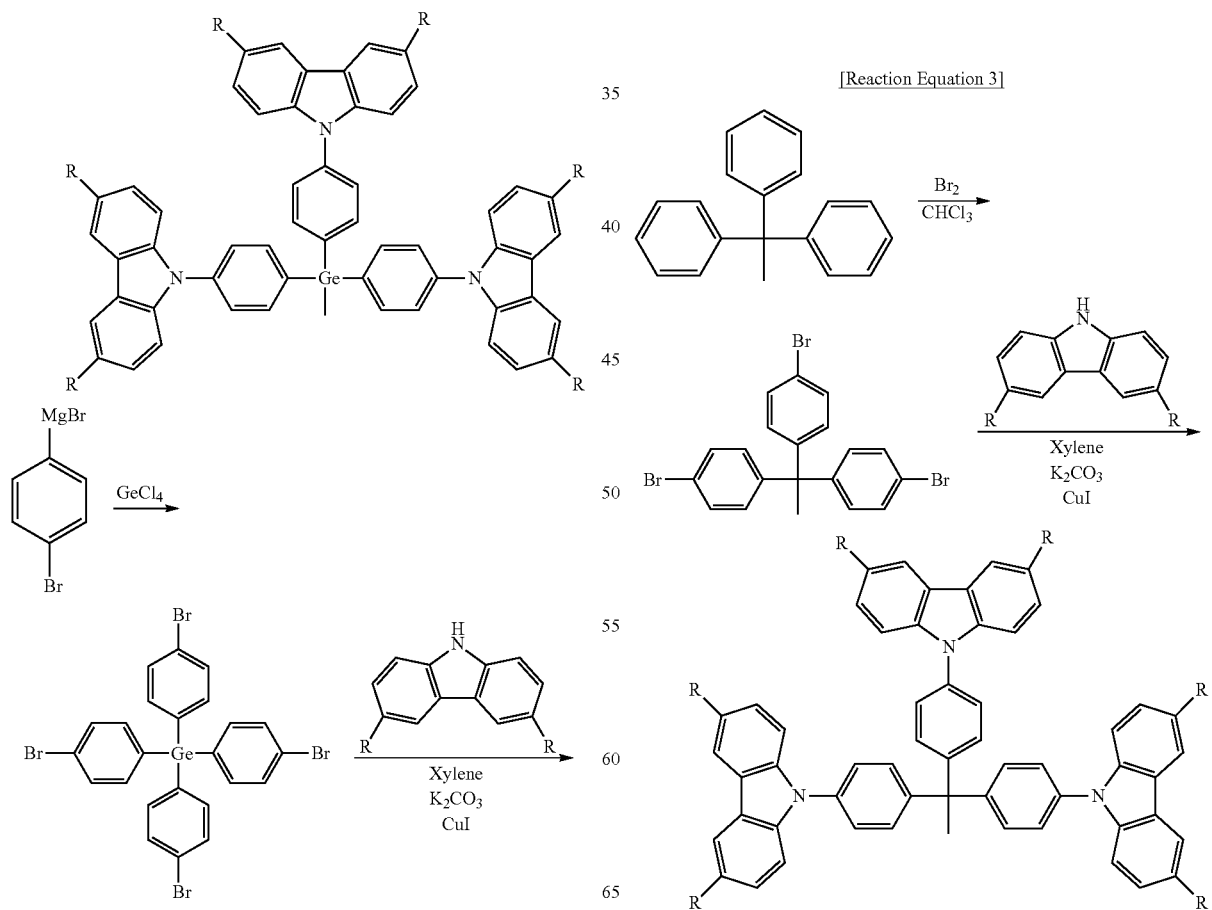

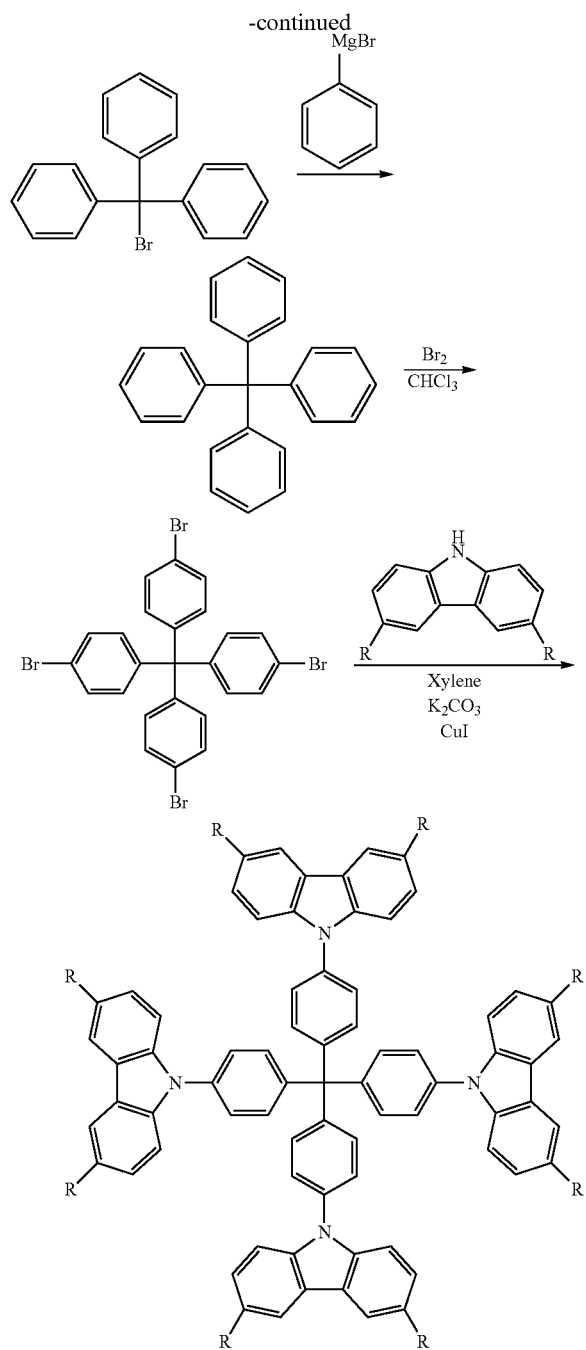

Moreover, the central atom (M) may be C, and synthesis may be performed according to Reaction Equation 3.

Like in Reaction Equation 3, $Br_2$ is added to a C-compound having three or four benzenes to substitute Br. In addition, carbazole in which the alkyl group (R) is substituted is reacted.

The host material according to the exemplary embodiments of the present invention, as described above, has a structure where the central atom (M) selected from the Group 14 element is used as the core and three or more, that is, three or four carbazole compounds (R1) are bonded around the core. In addition, the structure where the carbazole compound (R1) includes at least one carbazole and at least one alkyl group (R) is introduced as a substituent group into carbazole is secured. Accordingly, the host material according to the exemplary embodiments of the present invention has high triplet energy (ET), the excellent electrical property such as charge mobility, excellent thermal stability, and the like.

Specifically, the host material according to the exemplary embodiments of the present invention has high triplet energy of 3.0 eV or more (ET≥3.0 eV). Further, the host material may have excellent charge mobility of $1.0 \times 10^{-3}$ $cm^2$/v.s or more, preferably $2.0 \times 10^{-3}$ $cm^2$/v.s or more, and more preferably $3.0 \times 10^{-3}$ $cm^2$/v.s or more according to the type of the central atom (M) and the carbazole compound (R1). In addition, the host material may have high thermal stability (Tg) of 150° C. or more. Therefore, the host material according to the exemplary embodiments of the present invention may implement high luminous efficiency together with a deep blue color when the host material is applied to the organic light-emitting device (OLEDs), specifically the blue phosphorescent organic light-emitting device (PHOLEDs).

In this case, three or four carbazole compounds are bonded around the Group 14 element, but in the case where the alkyl group is not substituted in carbazole, triplet energy (ET) is relatively favorable but the electrical property (charge mobility and the like) and thermal stability are low. Further, the alkyl group is substituted in carbazole, but in the case where less than three, that is, only one or two carbazole compounds are bonded around the Group 14 element, the electrical property (charge mobility and the like) and thermal stability are low, and triplet energy (ET) is low.

The aforementioned host material according to the exemplary embodiments of the present invention may be used for various purposes including the blue phosphor.

Preferably, the host material may be applied to an organic thin film and the organic light-emitting device (OLEDs) according to the exemplary embodiments of the present invention as will be described below. Hereinafter, the organic thin film and the organic light-emitting device (OLEDs) according to the exemplary embodiments of the present invention will be described.

The organic thin film according to the exemplary embodiments of the present invention constitutes the organic light-emitting device (OLEDs), and specifically the blue phosphorescent organic light-emitting device (PHOLEDs), and may have a multi-layered structure of one layer or two or more layers. In this case, at least one layer includes the host material according to the exemplary embodiments of the present invention.

According to the specific exemplary embodiments, the organic thin film according to the exemplary embodiments of the present invention includes a hole transport layer (HTL); an emitting layer (EML) formed on the hole transport layer (HTL); and an electron transport layer (ETL) formed on the emitting layer (EML). Further, the organic thin film according to the exemplary embodiments of the present invention may further include a hole injection layer (HIT) formed on the hole transport layer (HTL) and an electron injection layer (EIL) formed on the electron transport layer (ETL) in some cases. Additionally, the organic thin film according to the exemplary embodiments of the present invention may further include an electron blocking layer (EBL) or a hole blocking layer (HBL) according to an emission characteristic of the emitting layer (EML).

In this case, among a plurality of layers, at least one layer includes the host material according to the exemplary embodiments of the present invention. Preferably, one or more selected from the emitting layer (EML), the hole transport layer (HTL), and the electron transport layer (ETL)

include the host material according to the exemplary embodiments of the present invention. More preferably, the host material according to the exemplary embodiments of the present invention may be included in at least emitting layer (EML). Hereinafter, preferable examples of each layer constituting the organic thin film according to the exemplary embodiments of the present invention will be described below.

The emitting layer (EML) may be constituted by a single layer or a plurality of layers, and includes a host and a dopant. In this case, the host includes the host material according to the exemplary embodiments of the present invention. The host may further include a typically used host material in addition to the host material according to the exemplary embodiments of the present invention.

The additionally included host material is a typical matter, and for example, 4,4'-N,N-dicarbazolebiphenyl (CBP), 1,3-N,N-dicarbazolebenzene (mCP), and a derivative thereof may be used. Further, the host material may be selected from (4,4'-bis(2,2-diphenyl-ethen-1-yl)diphenyl (DPVBi), bis (styryl)amine systems (DSA), bis(2-methyl-8-quinolinolato)(triphenylsiloxy)aluminum(III) (SAlq), bis(2-methyl-8-quinolinolato)(para-phenolato)aluminum(III) (BAlq), 3-(biphenyl-4-yl)-5-(4-dimethylamino)4-(4-ethylphenyl)-1,2,4-triazole (p-EtTAZ), 3-(4-biphenyl)-4-phenyl-5-(4-tertiary-butylphenyl)-1,2,4-triazole (TAZ), 2,2',7,7'-tetrakis(biphenyl-4-yl)-9,9'-spirofluorene (spiro-DPVBI), tris(para-ter-phenyl-4-yl)amine (p-TTA), 5,5-bis(dimesitylboryl)-2,2-bithiophene (BMB-2T), perylene, and the like.

Further, as the dopant, one or more selected from typically used FIr6, FIrpic, and the like may be used, and additionally, the dopant may be selected from DCM1 (4-dicyanomethylene-2-methyl-6-(para-dimethylaminostyryl)-4H-pyran), 4-dicyanomethylene-2-methyl-6-(julolydine-4-yl-vinyl)-4H-pyran, 4-dicyanomethylene-2-methyl-6-(1,1,7,7-tetramethyljulolydyl-9-enyl)-4H-pyran, 4-dicyanomethylene-2-tertiarybutyl-6-(1,1,7,7-tetramethyljulolydyl-9-enyl)-4H-pyran, 4-dicyanomethylene-2-isopropyl-6-(1,1,7,7-tetramethyljulolydyl-9-enyl)-4H-pyran, Nile red, Rubrene, and the like.

The hole transport layer (HTL) and the electron transport layer (ETL) are not particularly limited. A typical matter in the art may be used in the hole transport layer and the electron transport layer. The hole transport layer (HTL) may be selected from, for example, 4,4'-bis[N-(1-naphtyl)-N-phenyl-amino]-biphenyl (NPD), N,N'-diphenyl-N,N'-bis(3-methylphenyl)-1,1'-biphenyl-4,4'-diamine (TPD), and the like. In addition, the electron transport layer (ETL) may be selected from, for example, aryl-substituted oxadiazole, aryl-substituted triazole, aryl-substituted phenanthroline, benzoxazole, and benzothiazole compounds, and the like, and specific examples thereof may include 4-bis[N-(1-naphtyl)-N-phenyl-amino]biphenyl (BAlq), 1,3-bis(N,N-t-butyl-phenyl)-1,3,4-oxadiazole (OXD-7), 3-phenyl-4-(1'-naphtyl)-5-phenyl-1,2,4-triazole (TAZ), tris(8-quinolinato) aluminum(III) (Alq3), and the like.

Moreover, even in the case of the hole injection layer (HIL) and the electron injection layer (EIL), a typical matter may be used. The hole injection layer (HIL) may be selected from, for example, materials such as typical PEDOT/PSS or copper phthalocyanine (CuPc), 4,4',4"-tris(3-methylphenyl-phenylamino)triphenylamine (m-MTDATA), and 4,4',4"-tris (N-(2-naphtyl)-N-phenyl-amino)-triphenylamine (2-TNATA). In addition, as the electron injection layer (EIL), for example, LiF may be used.

As described above, a typically used material may be used in the layers constituting the organic thin film according to the exemplary embodiments of the present invention, and is not limited to the aforementioned matters. Preferably, the host material according to the exemplary embodiments of the present invention may be included in at least emitting layer (EML) among the plurality of layers. In this case, the host material according to the exemplary embodiments of the present invention is not particularly limited based on a total weight of the emitting layer (EML), but may be included in an amount of 5 to 95 wt %.

Meanwhile, the organic light-emitting device (OLEDs) according to the exemplary embodiments of the present invention includes an anode, the organic thin film, and a cathode, and may preferably have a structure where the anode, the organic thin film, and the cathode are sequentially laminated. In this case, the organic thin film is the same as above. That is, the organic light-emitting device (OLEDs) according to the exemplary embodiments of the present invention includes the organic thin film including the host material of the exemplary embodiments of the present invention. Further, the organic light-emitting device (OLEDs) according to the exemplary embodiments of the present invention is selected from the blue phosphor organic light-emitting device (PHOLEDs) implementing a blue color.

Moreover, the organic light-emitting device (OLEDs) according to the exemplary embodiments of the present invention may include a substrate for supporting the anode, the organic thin film, and the cathode. As the substrate, for example, a glass substrate may be used.

The anode is not particularly limited, and may be constituted by a material selected from, for example, metal oxide or metal nitride such as ITO, IZO, tin oxide, zinc oxide, zinc aluminum oxide, and titanium nitride; metal such as gold, platinum, silver, copper, aluminum, nickel, cobalt, lead, molybdenum, tungsten, tantalum, and niobium; an alloy of the metal or an alloy of copper iodide; a conductive polymer such as polyaniline, polythiophene, polypyrrole, polyphenylenevinylene, poly(3-methylthiophene), and polyphenylene sulfide; and the like. The anode is preferably a transparent electrode selected from ITO, IZO, and the like.

The cathode may be selected from the metal. The cathode may be selected from one or two or more alloys selected from, for example, Al, Ca, Mg, Ag, and the like, and preferably selected from Al or the alloy including Al.

The organic light-emitting device (OLEDs) according to the exemplary embodiments of the present invention, that is, the blue phosphor organic light-emitting device (PHOLEDs), includes the host material of the exemplary embodiments of the present invention in the organic thin film to implement a deep blue color and has excellent luminous efficiency.

Hereinafter, the exemplary embodiments of the present invention will be described in more detail in comparison with Examples and Comparative Examples. The following Examples are set forth to illustrate the present invention, but are not to be construed to limit the technical scope of the present invention.

EXAMPLE 1

<Manufacturing of Si-Me>

Through Reaction Equation 1, the host material (Si-Me) in which the three carbazole compounds were bonded around the central atom (M) Si and the methyl group (Me) as the alkyl group was substituted in carbazole was manufactured. Specifically, manufacturing of the host material was as follows.

1. 36.3 g of NBS (N-bromosuccinamide) and 50 mL of the solvent DMF (dimethylformamide) were put into 16.7 g of carbazole, and then agitated at 0° C. for 2 hours, and chloromethane (6.05 g, 120 mmol) was put thereinto, and then agitated at normal temperature for 16 hours.

2. After 1,4-dibromobenzene (2.4 g), $CuSO_4$ (0.06 g), and $K_2CO_3$ (1.1 g) were put into the compound reacted with chloromethane and reacted at 210° C., the 1M HCl solution (200 ml) and the 3M NaCl solution (100 ml) were put thereinto to extract the organic solution, and water was removed by anhydrous magnesium sulfate to obtain 1-bromo-4-(N-carbazolyl-di-methyl)benzene.

3. After 1-bromo-4-(N-carbazolyl-di-methyl)benzene (2.09 g, 6 mmol) was dissolved in 30 ml of the THF (tetrahydrofuran) solution, 2.5M hexane (2.64 ml, 6.6 mmol) in which n-BuLi (butyllithium) was dissolved was put thereinto at −78° C., and trichloromethylsilane (0.24 m, 6 mmol) was slowly put after 30 minutes, and reacted at normal temperature for 12 hours. Next, ethanol was put, the water layer was removed by LiCl, and filtering was then performed. In addition, separation was performed by the column using the mixture of ethyl acetate and hexane to obtain the final product (yield 85%). The final product was confirmed through $^1$H-NMR analysis.

The thusly manufactured host material according to the present Example 1 has the structure where M is Si, n is 3, R1 is represented by Chemical Formula 4, and R2 is the methyl group in Chemical Formula 1 $[(R1)_n\text{-}M\text{-}(R2)_{4-n}]$.

EXAMPLE 2

<Manufacturing of Ge-Me>

Through Reaction Equation 2, the host material (Ge-Me) in which the three carbazole compounds were bonded around the central atom (M) Ge and the methyl group (Me) as the alkyl group was substituted in carbazole was manufactured. Specifically, manufacturing of the host material was as follows.

1. After Mg was activated and put into 30 ml of the THF solution at 0° C., bromobenzene (100 g) was put thereinto, and 70 ml of the THF solution was slowly further put. In addition, after 3 hours, $GeCl_4$ (27.07 g) was slowly put at 0° C., and MeLi (5.53 g) was put while being maintained 0° C. for 1 hour, and agitated at normal temperature. After the reaction mixture was cooled, water was added, extraction was performed by methylene chloride, and the compound $(Ge(Ph)_3Me)$ was then separated by the column using the hexane:methylene chloride (1:1 volume ratio) mixture as the eluent solution.

2. After 5 g of $Ge(Ph)_3Me$ was dissolved in the $CHCl_3$ solvent, $Br_2$ (12.21 g) was put thereinto and agitated at normal temperature. After the reaction mixture was cooled, water was added, extraction was performed by methylene chloride, and the target compound (Ge-compound in which three Br-benzenes were bonded) was then separated by the column using the hexane:methylene chloride (5:1 volume ratio) mixture as the eluent solution.

3. After carbazole (9.25 g) in which the methyl group (Me) was substituted was dissolved in xylene, 5 g of the Ge-compound was put thereinto, and $K_2CO_3$ (7.05 g) and CuI (0.4 g) were put and then agitated at 210° C. After the reaction mixture was cooled, water was added, extraction was performed by methylene chloride, and separation was performed by the column using the hexane:methylene chloride (3:1 volume ratio) mixture as the eluent solution to obtain the final product (yield 80%). The final product was confirmed through $^1$H-NMR analysis.

The thusly manufactured host material according to the present Example 2 has the same chemical structure as that of Example 1, except that the central atom is Ge. Specifically, the host material according to the present Example 2 has the structure where M is Ge, n is 3, R1 is represented by Chemical Formula 4, and R2 is the methyl group in Chemical Formula 1 $[(R1)_n\text{-}M\text{-}(R2)_{4-n}]$.

EXAMPLE 3

<Manufacturing of C-Me>

Through Reaction Equation 3, the host material (C-Me) in which the three carbazole compounds were bonded around the central atom (M) C and the methyl group (Me) as the alkyl group was substituted in carbazole was manufactured. Specifically, manufacturing of the host material was as follows.

1. After 3 g of $C(Ph)_3Me$ was dissolved in the $CHCl_3$ solvent, $Br_2$ (3.99 g) was put thereinto and agitated at normal temperature. After the reaction mixture was cooled, water was added, extraction was performed by methylene chloride, and the target compound (C-compound in which three Br-benzenes were bonded) was then separated by the column using the hexane:methylene chloride (5:1 volume ratio) mixture as the eluent solution.

2. After carbazole (3.60 g) in which the methyl group (Me) was substituted was dissolved in xylene, the C-compound (2 g) was put thereinto, and $K_2CO_3$ (2.74 g) and CuI (0.15 g) were put and then agitated at 210° C. After the reaction mixture was cooled, water was added, extraction was performed by methylene chloride, and the final product was obtained by the column using the hexane:methylene chloride (1:1 volume ratio) mixture as the eluent solution (yield 80%). The final product was confirmed through $^1$H-NMR analysis.

The thusly manufactured host material according to the present Example 3 has the same chemical structure as that of Example 1, except that the central atom is C. Specifically, the host material according to the present Example 3 has the structure where M is C, n is 3, R1 is represented by Chemical Formula 4, and R2 is the methyl group in Chemical Formula 1 $[(R1)_n\text{-}M\text{-}(R2)_{4-n}]$.

Figure 2:
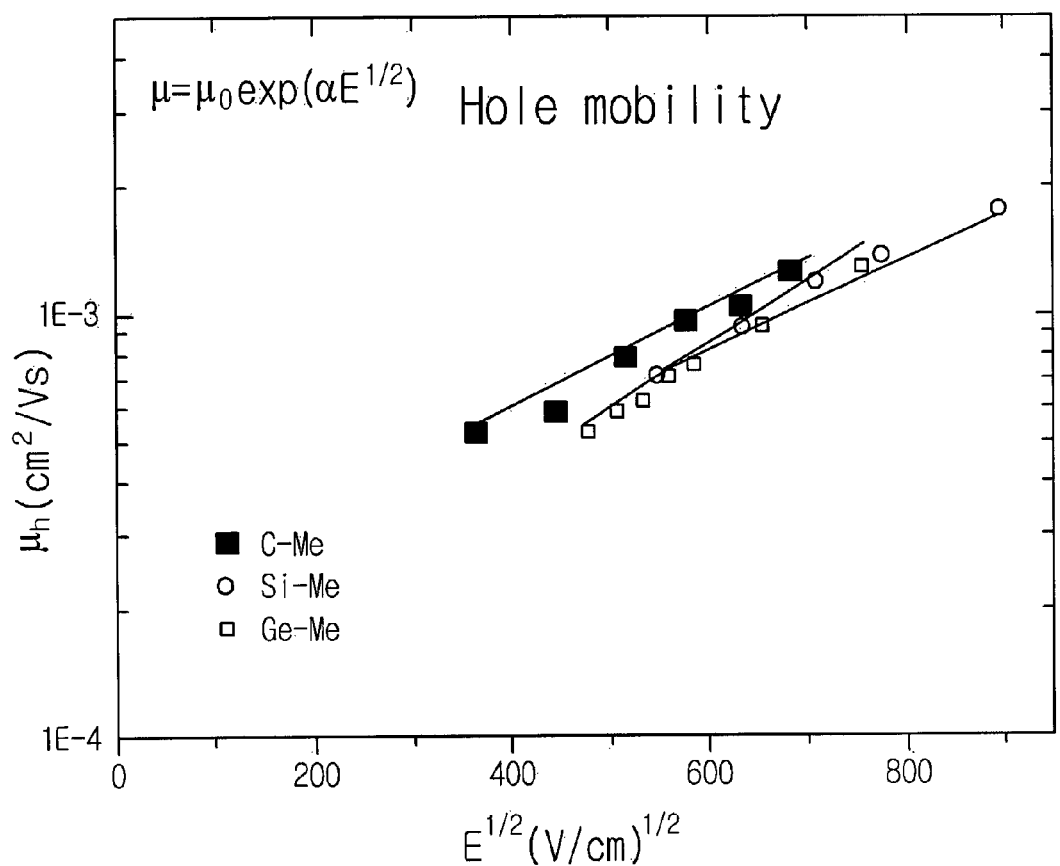
FIG. 2 is a graph illustrating a measurement result of hole mobility of the host material manufactured according to the Example of the present invention.
Figure 3:
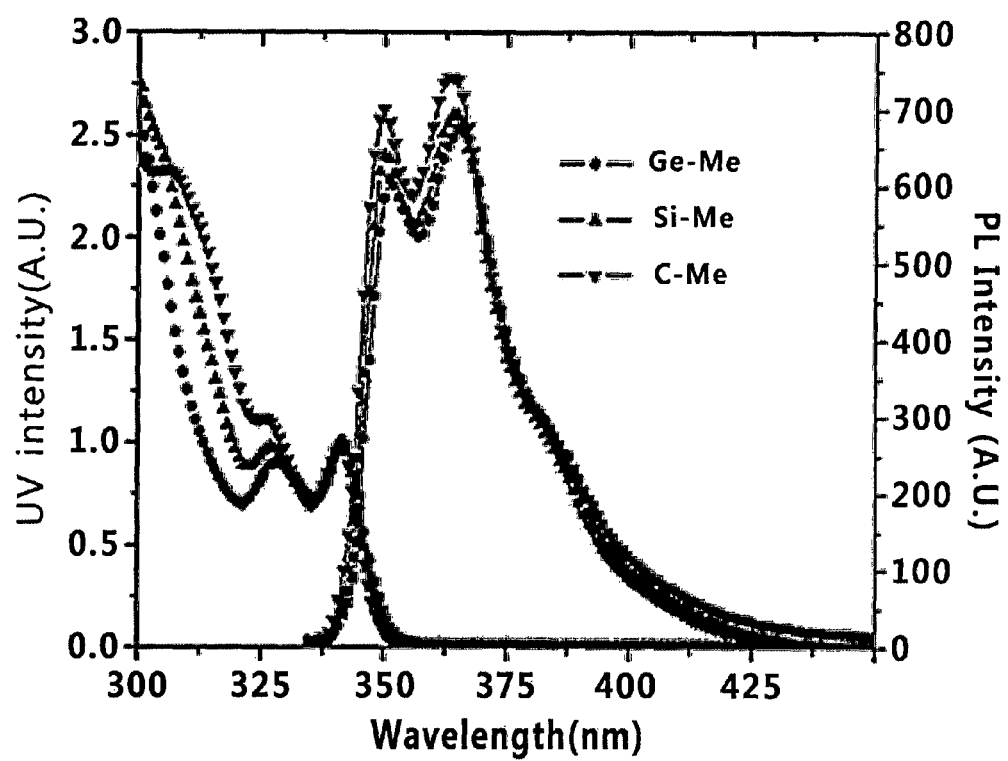
FIG. 3 is a graph illustrating a measurement result of UV-PL intensities of the host material manufactured according to the Example of the present invention.

Triplet energies, hole mobilities, and UV-PL intensities of the host materials (Si-Me, Ge-Me, and C-Me) manufactured according to Examples 1 to 3 were manufactured, and the results are illustrated in the accompanying FIGS. 1 to 3. FIG. 1 is a graph illustrating a measurement result of triplet energy, FIG. 2 is a graph illustrating a measurement result of hole mobility, and FIG. 3 is a graph illustrating a measurement result of UV-PL intensities.

First, as illustrated in FIG. 1, it could be seen that all host materials manufactured according to the Examples had high triplet energy of 3.0 eV or more, that is, 3.05 eV, in the wavelength range of 400 to 420 nm, which was the blue excitation wavelength. Further, as illustrated in FIGS. 2 and 3, it could be seen that hole mobility and intensities of UV and PL were evaluated to be excellent.

EXAMPLE 4

<Manufacturing of Si—Pr>

Manufacturing was performed by the same method as Example 1, but the propyl group was substituted in carbazole by using chloropropane instead of chloromethane (yield 47%). The final product was confirmed through $^1$H-NMR analysis.

Specifically, the host material according to the present Example 4 has the structure where M is Si, n is 3, R1 is represented by Chemical Formula 5, and R2 is the methyl group in Chemical Formula 1 [(R1)$_n$-M-(R2)$_{4-n}$].

EXAMPLE 5

<Manufacturing of Ge-tBu>

Manufacturing was performed by the same method as Example 2, but the t-butyl group was substituted in carbazole. That is, manufacturing was performed by the same method as Example 2, except that carbazole in which the t-butyl group (tBu) was substituted was used instead of carbazole in which the methyl group (Me) was substituted (yield 80%). The final product was confirmed through $^1$H-NMR analysis.

Specifically, the host material according to the present Example 5 has the structure where M is Ge, n is 3, R1 is represented by Chemical Formula 6, and R2 is the methyl group in Chemical Formula 1 [(R1)$_n$-M-(R2)$_{4-n}$].

EXAMPLE 6

<Second Manufacturing of Ge-Me>

Through Reaction Equation 2, the host material (Ge-Me) in which the four carbazole compounds were bonded around the central atom (M) Ge and the methyl group (Me) as the alkyl group was substituted in carbazole was manufactured. Specifically, manufacturing of the host material was as follows.

1. 10 g of MgBr-Ph-Br and 3.86 g of GeCl$_4$ were reacted for 12 hours. After the reaction mixture was cooled, water was added, extraction was performed by methylene chloride, and the target compound (Ge-compound in which four Br-benzenes were bonded) was then separated by the column using the hexane:methylene chloride (1:1 volume ratio) mixture as the eluent solution.

2. After carbazole (17.49 g) in which the methyl group (Me) was substituted was dissolved in xylene, the Ge-compound (8 g) in which Br-benzenes were bonded was put thereinto, and K$_2$CO$_3$ (27.97 g) and CuI (0.41 g) were put and then agitated at 210° C. After the reaction mixture was cooled, water was added, extraction was performed by methylene chloride, and separation was performed by the column using the hexane:methylene chloride (3:1 volume ratio) mixture as the eluent solution to obtain the final product (yield 41%). The final product was confirmed through $^1$H-NMR analysis.

The thusly manufactured host material according to the present Example 6 has the structure where M is Ge, n is 4, and R1 is represented by Chemical Formula 4 in Chemical Formula 1 [(R1)$_n$-M-(R2)$_{4-n}$].

The following [Table 1] describes results of triplet energy (wavelength range of 400 to 420 nm), charge mobility, and the glass transition temperature (Tg) of the host materials manufactured according to Examples 1 to 6. In this case, triplet energy was evaluated through the laser measuring machine (1 ns pulsed nitrogen laser, products manufactured by Photon Technology International, Inc., model name: GL-3300), and charge mobility was analyzed through the laser measuring machine (model name: GL-3300) and the Digital Oscilloscope (products manufactured by LeCroy Corporation, model name: LC 572A). In addition, the glass transition temperature (Tg) was evaluated by using the Pysis Diamond DSC measuring machine manufactured by Perkin-Elmer, Inc.

In the following [Table 1], Comparative Examples 1 and 2 were provided to be compared to the Examples of the present invention, in Comparative Example 1, the matter synthesized so that the methyl group (Me) was substituted in carbazole and the two carbazole compounds were bonded around the central atom Si was used, and in Comparative Example 2, the matter synthesized so that the three carbazole compounds were bonded around the central atom Si and the methyl group (Me) was not substituted in carbazole was used. Specifically, Comparative Example 1 has the structure where M is Si, n is 2, R1 is represented by Chemical Formula 4, and both two R2s are the methyl group in Chemical Formula 1 [(R1)$_n$-M-(R2)$_{4-n}$]. In addition, Comparative Example 2 has the structure where M is Si, n is 3, R1 is carbazole in which the alkyl group (methyl group) is not substituted, and R2 is the methyl group in Chemical Formula 1 [(R1)$_n$-M-(R2)$_{4-n}$].

TABLE 1

| <Evaluation results of physical properties of the host materials> | | | | | | | | |
|---|---|---|---|---|---|---|---|---|
| Note | Example 1 (Si—Me) | Example 2 (Ge—Me) | Example 3 (C—Me) | Example 4 (Si—Pr) | Example 5 (Ge—tBu) | Example 6 (Ge—Me) | Comparative Example 1 | Comparative Example 2 |
| n* | 3 | 3 | 3 | 3 | 3 | 4 | 2 | 3 |
| R** | Methyl | Methyl | Methyl | n-propyl | t-butyl | Methyl | Methyl | — |
| Triplet energy (400 to 420 nm) | 3.05 eV | 3.05 eV | 3.05 eV | 3.02 eV | 3.04 eV | 3.04 eV | 2.91 eV | 3.05 eV |
| Charge mobility (cm$^2$/v · s) | $3.5 \times 10^{-3}$ | $2.9 \times 10^{-3}$ | $1.8 \times 10^{-3}$ | $3.2 \times 10^{-3}$ | $2.1 \times 10^{-3}$ | $3.3 \times 10^{-3}$ | $6.2 \times 10^{-4}$ | $4.0 \times 10^{-4}$ |
| Tg (° C.) | 155 | 152 | 150 | 153 | 150 | 154 | 102 | 99 | n* is the number of carbazole compounds bonded to the central atom,
R** is the alkyl group substituted in the carbazole compound.

As described in [Table 1], it could be seen that the host materials according to the Examples (1 to 6) of the present invention had high triplet energy of 3.0 eV or more, and charge mobility of $1.8 \times 10^{-3}$ cm$^2$/v.s or more and preferably excellent charge mobility of $3.5 \times 10^{-3}$ cm$^2$/v.s. Further, it could be seen that the host materials had a very excellent value at 150° C. or more in terms of thermal stability (Tg).

However, it could be seen that even though the alkyl group (Me) was substituted in carbazole, in the case of Comparative Example 1 where only the two carbazole compounds were bonded to the Si element, charge mobility and thermal stability (Tg) were reduced and triplet energy was low. In addition, it could be seen that in the case of Comparative Example 2 where the three carbazole compounds were bonded around the Si element but the alkyl group (Me) was not substituted in carbazole, triplet energy was favorable, but charge mobility and thermal stability were very low.

Figure 4:
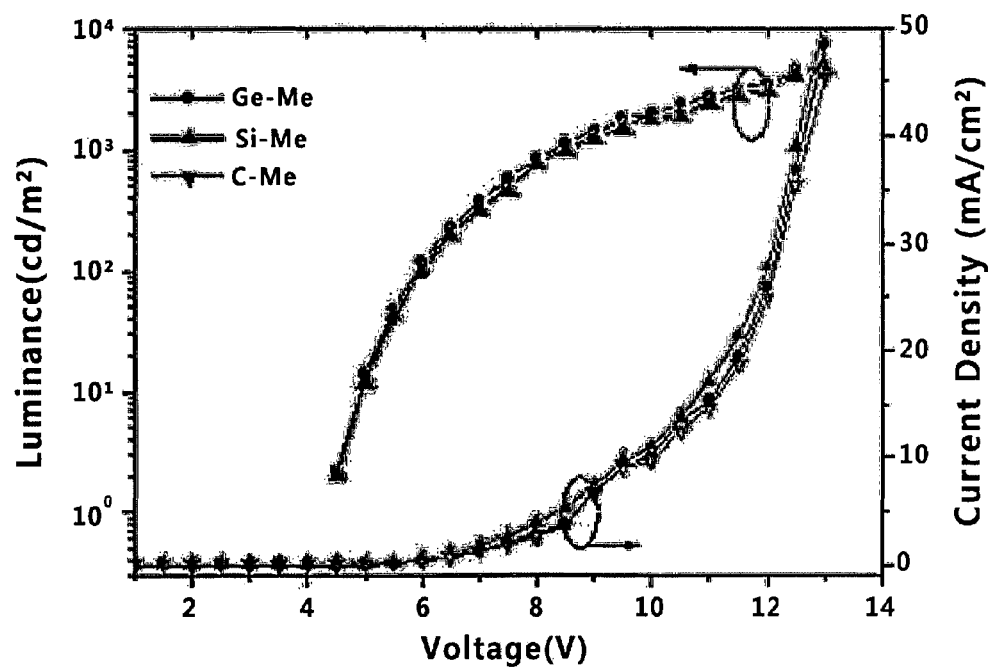
FIG. 4 is a graph illustrating a measurement result of luminance and a current density of PHOLEDs manufactured according to the Example of the present invention.

Meanwhile, the accompanying FIG. 4 is a graph illustrating measurement results of luminances and current densities of the PHOLEDs manufactured by using the host materials according to Examples 1 to 3. In this case, typically, the PHOLEDs were manufactured to have the laminate structure of the anode (ITO)/hole injection layer/hole transport layer/emitting layer/electron transport layer/electron injection layer (LiF)/cathode (Al), and the emitting layer was manufactured by adding the host material according to each Example to the typically used dopant FIr6 in the amount of 50 wt % based on the total weight of the emitting layer.

As illustrated in the accompanying FIG. 4, the PHOLEDs had excellent luminance and current density, and the three host materials (Si-Me, Ge-Me, and C-Me) had almost similar measurement values.

As confirmed in the aforementioned Examples, it can be seen that the host materials according to the exemplary embodiments of the present invention have high triplet energy of 3.0 eV or more at the blue excitation wavelength, a very excellent electrical characteristic such as charge mobility, and excellent thermal stability (Tg). Further, it can be seen that the PHOLEDs to which the host materials are applied have excellent luminous efficiency.

INDUSTRIAL APPLICABILITY

A host material for a blue phosphor, an organic thin film including the host material, and an organic light-emitting device including the organic thin film are provided. The organic light-emitting device and the like may be helpfully used in displays and the like.

The invention claimed is:

1. A host material for a blue phosphor, wherein the host material is represented by the following Chemical Formula 1:

$(R1)_n\text{-}M\text{-}(R2)_{4-n}$    [Chemical Formula 1]

in the Chemical Formula 1,
M is Ge,
n is 3,
R1 is a carbazole compound in which an alkyl group is substituted in carbazole, and
R2 is selected from hydrogen, an aliphatic compound, and an aromatic compound.

2. The host material for a blue phosphor of claim 1, wherein R2 of the Chemical Formula 1 is selected from C1 to C20 alkyl, C6 to C20 aryl, C3 to C20 heteroaryl, alkyl in which C3 to C20 heteroaryl is substituted, and aryl in which C1 to C20 alkyl or C3 to C20 heteroaryl is substituted.

3. The host material for a blue phosphor of claim 1, wherein R2 of the Chemical Formula 1 is selected from the group illustrated in the following Chemical Formula 2:

[Chemical Formula 2]

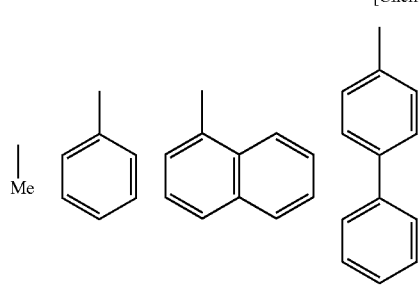

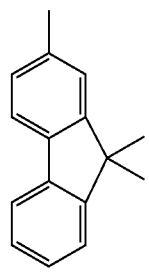

in the Chemical Formula 2, Me is a methyl group.

4. The host material for a blue phosphor of claim 1, wherein R1 of the Chemical Formula 1 is represented by the following Chemical Formula 3:

[Chemical Formula 3]

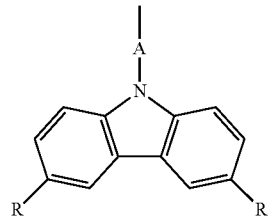

in the Chemical Formula 3,
R is an alkyl group, and
A is selected from C6 to C20 arylene, C3 to C20 heteroarylene, arylene in which C1 to C20 alkyl is substituted, heteroarylene in which C1 to C20 alkyl is substituted, and arylene in which C3 to C20 heteroaryl is substituted.

5. The host material for a blue phosphor of claim 1, wherein R1 of the Chemical Formula 1 is selected from matters represented by the following Chemical Formulas 4 to 8:

[Chemical Formula 4]

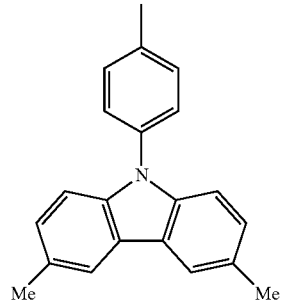

[Chemical Formula 5]

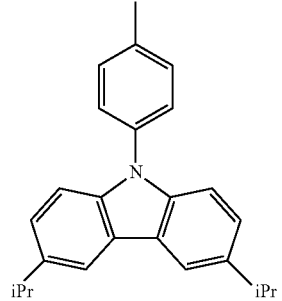

[Chemical Formula 6]

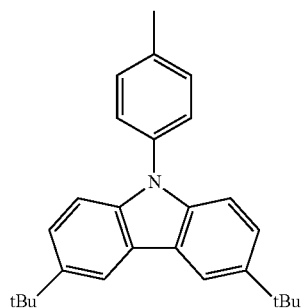

[Chemical Formula 7]

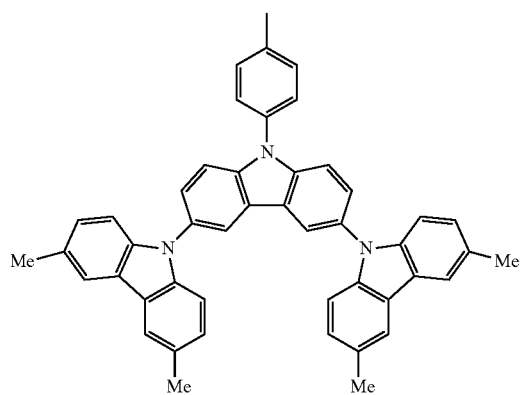

[Chemical Formula 8]

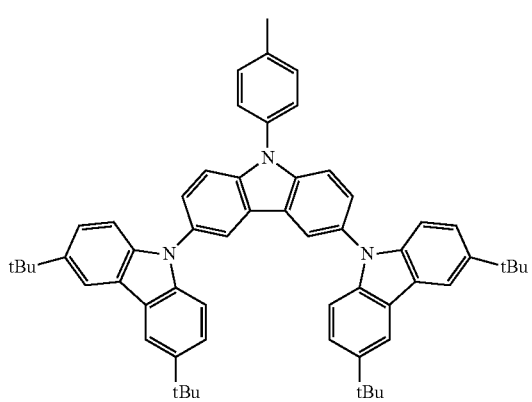

in the Chemical Formulas 4 to 8, Me is a methyl group, iPr is an iso-propyl group, and tBu is a tertiary-butyl group.

6. An organic thin film for an organic light-emitting device comprising:
the host material for a blue phosphor of claim 1.

7. The organic thin film for an organic light-emitting device of claim 6, wherein the organic thin film includes a hole transport layer, an emitting layer, and an electron transport layer, and the emitting layer includes the host material for a blue phosphor.

8. An organic light-emitting device comprising:
the organic thin film of claim 6.

* * * * *